United States Patent [19]

Kamiya et al.

[11] Patent Number: 4,637,342
[45] Date of Patent: Jan. 20, 1987

[54] VACUUM PROCESSING APPARATUS

[75] Inventors: Osamu Kamiya, Machida; Yasutomo Fujiyama, Kawasaki; Kyosuke Ogawa, Tokyo; Takashi Kurokawa, Ueno, all of Japan

[73] Assignee: Canon Kabushiki Kaisha, Tokyo, Japan

[21] Appl. No.: 705,522

[22] Filed: Feb. 26, 1985

[30] Foreign Application Priority Data

Mar. 2, 1984 [JP] Japan ................................ 59-39896

[51] Int. Cl.$^4$ ............................................. C23C 13/08
[52] U.S. Cl. ................................. 118/719; 118/724; 118/729; 118/730; 118/733; 118/50
[58] Field of Search ............... 118/719, 733, 729, 730, 118/723, 724, 50

[56] References Cited

U.S. PATENT DOCUMENTS 3,915,117 10/1975 Schertler ............................ 118/49

Primary Examiner—Richard Bueker
Attorney, Agent, or Firm—Fitzpatrick, Cella, Harper & Scinto

[57] ABSTRACT

A vacuum processing apparatus for applying a vacuum working process to a substrate to be processed by a plurality of processing steps comprises vacuum containers exclusively for use for processing disposed in place for each of the processing steps, and a vacuum container exclusively for use for conveyance movable between the vacuum containers exclusively for use for processing. The vacuum containers are provided with opening-closing gates which can be connected to each other. The substrate to be processed is transferably movable between the vacuum containers exclusively for use for processing and the vacuum container exclusively for use for conveyance.

9 Claims, 4 Drawing Figures

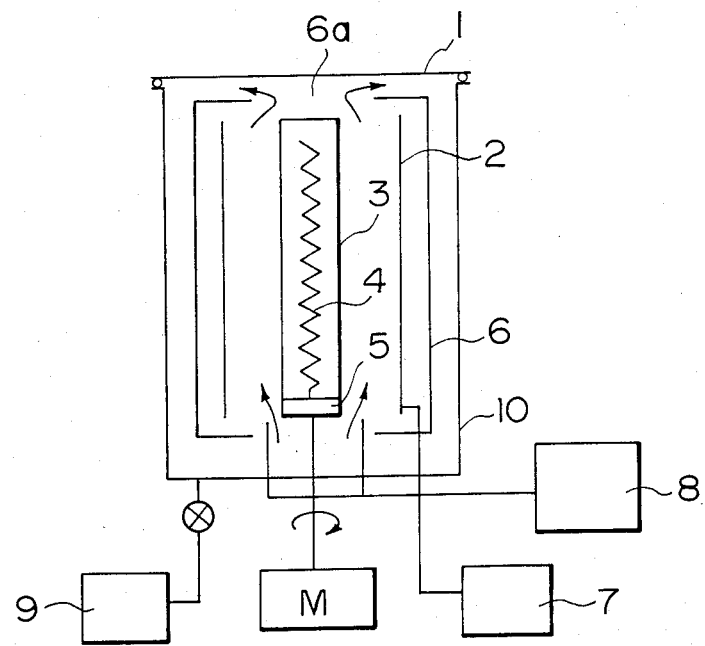
FIG. I
PRIOR ART
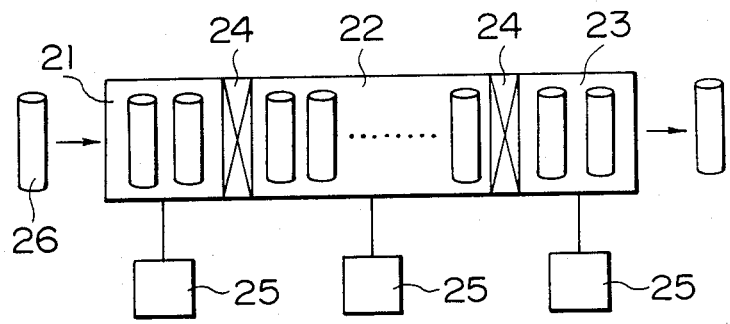
FIG. 2
PRIOR ART

VACUUM PROCESSING APPARATUS

BACKGROUND OF THE INVENTION

1. Field of the Invention

This invention relates to a vacuum processing apparatus suitable for various working processes utilizing vacuum, and more particularly to a vacuum processing apparatus suitable for forming a thin film on a substrate to be processed by the use of the plasma CVD (chemical vapor deposition) method.

2. Description of the Prior Art

In recent years, attention has been paid to the reactive sputtering method and the plasma CVD method as a thin film forming method. For example, the plasma CVD method is such that the pressure in a reaction chamber is reduced to a desired degree of vacuum and a gas as a raw material is supplied to the reaction chamber, whereafter the gas is decomposed by glow discharge or are discharge and a thin film is formed on a substrate disposed in the reaction chamber. Amorphous silicon (hereinafter referred to as "a-Si" formed by this method with silane ($SiH_4$ or $Si_2H_6$) gas as the raw material, the localized level present in the inhibited zone of a-Si is relatively small in number, and as the result, it becomes capable to control electrons by the doping of substitution type impurities. Therefore the film can be used also as an electrophotographic photosensitive medium.

FIG. 1 of the accompanying drawings shows an example of a plasma CVD apparatus according to the prior art and more particularly, it is a side cross-sectional view of a typical batch type plasma CVD apparatus for forming an Si layer on a cylindrical substrate 3 disposed in a single vacuum tank body 10 adapted to be hermetically sealed by a lid 1. A rotational mechanism 5 driven by a motor M is disposed at the center of the bottom of the vacuum tank body 10, and the cylindrical substrate 3 heated by an internal heater 4 is fixedly placed on the rotational mechanism 5. The heating by the internal heater 4 is necessary to maintain the substrate 3 at a high temperature (e.g., 250° C.) in order to form a stable a-Si layer on the substrate 3.

A cylindrical cathode electrode 2 connected to a high-frequency power source 7 is disposed around the substrate 3, and a cylindrical shield 6 for confining plasma gas is disposed around the electrode 2. A gas introducing system 8 for introducing raw material gas (silane gas) into the cylindrical shield 6 constituting a reaction chamber has its gas inlet disposed at the bottom of the shield 6, and an exhaust system 9 for making said reaction chamber vacuum has its exhaust port disposed at the bottom of the vacuum tank body 10.

In this apparatus, when the substrate 3 is heated and the raw material gas is introduced upwardly from below in the shield 6 of the reaction chamber, a high frequency electric power is applied from the power 7 to the cathode electrode 2 and plasma a discharge is produced between the electrode 2 and the substrate 3 which is an anode electrode, and the silane gas is decomposed and accordingly, an a-Si film is formed on the surface of the substrate.

The remaining gas after the reaction is discharged from an aperture 6a formed in the top of the shield 6, moves down between the outer wall of the shield 6 and the inner wall of the vacuum tank body 10 and is exhausted outwardly of the apparatus by the exhaust system 9.

However, in the above-described plasma CVD apparatus according to the prior art, only one substrate can be formed with a film by one reaction furnace, and this leads to poor working efficiency, that is, a disadvantage that this apparatus is unsuitable for mass production.

Further, the reaction furnace in the apparatus according to the prior art is exposed to the atmosphere each time the product formed with a film is removed and therefore adsorbs the moisture or gases in the atmosphere, and this leads to an inconvenience that the quality of the film is reduced or becomes unstable.

On the other hand, a so-called load lock type vacuum apparatus has been devised to eliminate these disadvantages. This apparatus, as shown in FIG. 2 of the accompanying drawings, comprises a substrate receiving chamber 21, a working process chamber 22 and a substrate removal chamber 23. In the substrate receiving chamber 21, preliminary processings such as the processing of the substrate between vacuum and the atmosphere and heating of the substrate, and then the substrate is moved into the working process chamber 22 through a gate 24 provided between the substrate receiving chamber 21 and the working process chamber 22 while the two chambers are kept in their vacuum state. Then, the substrate already formed with a film in the working process chamber 22 is transferred through a similar gate 24 provided between the working process chamber 22 and the removal chamber 23 and is subjected to processing such as cooling in the removal chamber 23, whereafter the atmosphere is introduced into the removal chamber and the substrate formed with a film is removed.

The apparatus of this type is efficient as compared with the apparatus of the former type, but it is not suitable as an apparatus for making an amorphous silicon electrophotographic photosensitive medium or the like.

That is, the above-described load lock type vacuum processing apparatus according to the prior art suffers from the following problems. Firstly, each vacuum tank becomes bulky to contain therein a number of large substrates such as photosensitive mediums and thus, the cost of the apparatus becomes high. Secondly, the heating of the substrate is effected from the inside of the cylindrical substrate and therefore, the conveying mechanism for the cylinder becomes complex.

SUMMARY OF THE INVENTION

The present invention has been made in view of the above-noted situation and an object thereof is to provide a vacuum processing apparatus in which not only the problems peculiar to the apparatuses according to the prior art are eliminated but also the instability of film resulting from adsorption of moisture, gases, etc. is eliminated because each processing step is effected in a vacuum processing chamber always kept in its vacuum state.

Another object of the present invention is to provide a vacuum processing apparatus for applying a vacuum working process to a substrate to be processed by a plurality of processing steps, characterized in that said apparatus comprised vacuum containers exclusively for use for processing disposed in place for each of said processing steps, and a vacuum container exclusively for use for conveyance movable between said vacuum containers exclusively for use for processing, said vacuum containers are provided with opening-closing gates which can be connected to each other, and said substrate to be processed is transferably movable between said vacuum containers exclusively for use for processing and said vacuum container exclusively for use for conveyance.

BRIEF DESCRIPTION OF THE DRAWINGS

FIG. 1 is a side cross-sectional view of a batch type plasma CVD apparatus according to the prior art which comprises a single vacuum tank.

FIG. 2 is a schematic illustration of a load lock type vacuum processing apparatus according to the prior art.

DESCRIPTION OF THE PREFERRED EMBODIMENTS

Embodiments of the present invention will hereinafter be described in detail by reference to the drawings.

Figure 3:
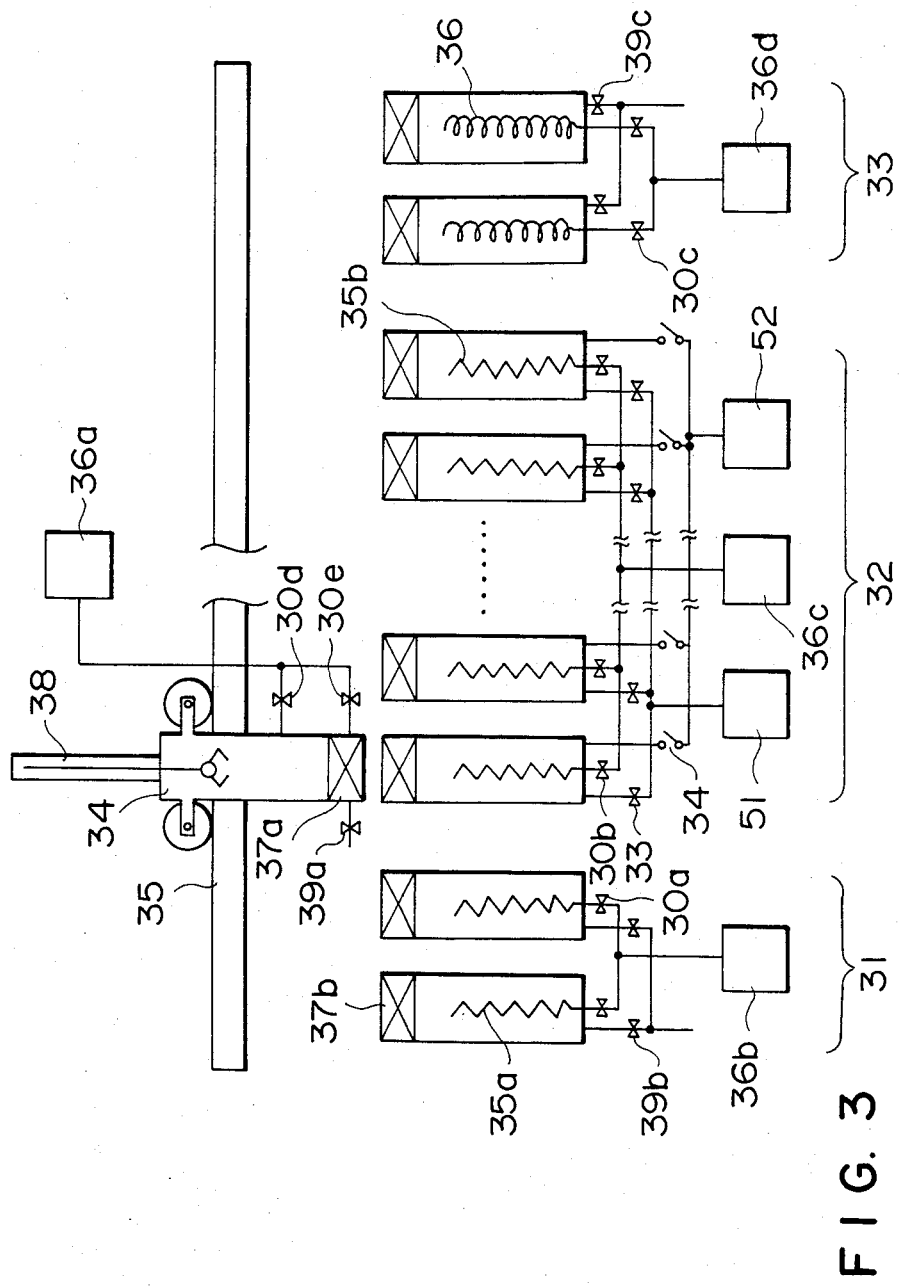
FIGS. 3 and 4 are illustration of vacuum processing apparatus according to embodiments of the present invention which use the linear movement system and the turrent system, respectively.

FIG. 3 shows an embodiment of the linear movement type according to the present invention. In FIG. 3, reference numeral 31 designates a group of substrate receiving containers disposed in place and exclusively for use for effecting vacuum drawing and preliminary processing, reference numeral 32 denotes a group of reaction containers disposed in place and exclusively for use for effecting processing such as a plasma CVD method, and reference numeral 33 designates a group of removal containers disposed in place and exclusively for use for effecting post-processing such as cooling of a substrate formed with a film and removal to the outside. These containers 31, 32 and 33 are linearly arranged in the order of processing steps, and each of them has an opening-closing gate 37b, and they constitute vacuum containers whose interior can be made vacuum by their respective exhaust systems 36b, 36c and 36d.

Reference numeral 34 designates a vacuum container exclusively for use for conveying the substrate whose interior can be made vacuum by an exhaust system 36a and which can be moved among said vacuum containers 31, 32 and 33 exclusively for use for effecting processing by moving means 35 while keeping their vacuum state. The container 34 has an opening-closing gate 37a which can be connected to the opening-closing gates 37b of said vacuum containers exclusively for use for effecting processing.

Description will now be made of a specific example of forming an amorphous film on the substrate to be processed, by the use of the above-described vacuum containers 31, 32, 33 exclusively for use for effecting processing and the vacuum container 34 exclusively for use for conveying the substrate.

First, the substrate to be processed is placed into a container 31 placed under the atmospheric condition, and then the interior of the container 31 is made vacuum by the exhaust system 36b through a valve 30a. At the same time, the substrate is heated by a heater 35a in the container 31. Then, the container 34 exclusively for use for conveying the substrate is moved and the gate 37a of the container 34 is connected to the gate 37b of the container 31, and the connected portion of these two gates is made vacuum by the exhaust system 36a through a valve 30e. Thereafter, the gates 37a and 37b are opened and the substrate is transferred from the container 31 into the container 34 by a lift mechanism 38 provided in the container 34, whereafter the gates 37a and 37b are closed and the containers 31 and 34 are disconnected from each other.

The container 34 having the substrate transferred thereinto is moved to above a reaction container 32, while the atmosphere is introduced into the container 31 through a valve 39b, whereafter the container 31 becomes ready to receive the next substrate.

As regards the container 34 moved to above the reaction container 32, the substrate is transferred from the container 34 into the reaction container 32 by effecting an operation similar to that when the substrate is removed from the container 31, and the substrate is subjected to the film forming process while being heated by a heater 35b in the reaction container 32.

At a stage whereat the film forming process has been terminated, the gate operation and conveyance similar to those described previously are effected and the substrate is removed from the container 32 and transferred into a container 33, whereafter the substrate is cooled by cooling means 36 and the atmosphere is introduced into the container 33 through a valve 39c, and then the substrate formed with a film is removed from the container 33.

Figure 4:
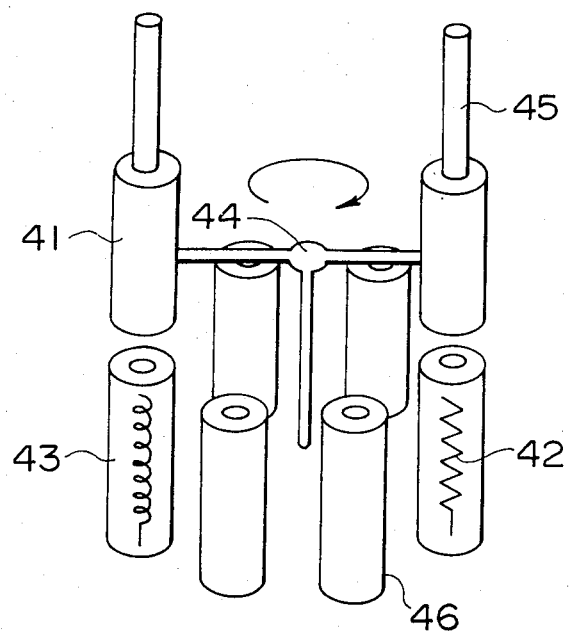

As regards the numbers of the substrate receiving containers 31, the reaction containers 32 and the removal containers 33, a combination of the numbers is selected depending on the processing times thereof so as to be most efficient. Also, a high-frequency power source 52, an exhaust pump 36c, a reaction gas introducing system 51, valves and vacuum matter used for the group of reaction containers 32 are installed in common or individually so as to be most suitable for their usages. The substrate receiving containers 31 may be installed in a clean room and can enter the preliminary processing by the apparatus of the present invention in their clean state immediately after the substrate has been washed. The heating process in the substrate receiving containers 31 and the cooling process in the removal containers 33 need not always be effected in vacuum, but may also be effected in the air or inert gas and in this latter case, the heating and cooling times can be shortened. The form of conveyance need not always be of the linear movement type, but for example, the containers of the embodiment of FIG. 4 may be arranged circumferentially and the containers exclusively for use for conveyance may be moved in the turret system. In FIG. 4, reference numeral 41 designates a vacuum conveyance container, reference numeral 42 denotes a substrate receiving container, reference numeral 43 designates a substrate removal container, reference numeral 44 denotes rotatable conveying means, reference numeral 45 designates a lift mechanism, and reference numeral 46 denotes reaction containers. In the case of this system, as compared with the linear movement system, a reduction in the installation area and simplification of the conveying mechanism can be achieved. Also, as regards the conveyance, a plurality of containers exclusively for use for conveyance can be made so as to move a plurality of substrates at a time, and in that case, the mass production effect will be further enhanced.

The above embodiments have been described as an apparatus for carrying out the plasma CVD method, whereas the present invention is not restricted thereto but can also be effectively applied to other working processes utilizing vacuum such as those of an ordinary evaporation apparatus, a sputtering apparatus or an etching apparatus or a combination thereof.

As described above, the vacuum processing apparatus of the present invention is excellent in working process ability and the cost of the apparatus is minimized and this apparatus can continuously effect the process in vacuum and in addition, the formed film processing containers are always kept in their vacuum state and therefore, the instability of the film resulting from the adsorption of moisture, gases or the like is eliminated and thus, substrates formed with films which are excellent in quality can be manufactured.

What we claimed is:

1. A vacuum processing apparatus for applying a vacuum working process to a substrate to be processed by a plurality of processing steps, characterized in that said apparatus comprises vacuum containers exclusively for use for processing disposed in place for each of said processing steps, and a vacuum container exclusively for use for conveyance movable between said vacuum containers exclusively for use for processing, said vacuum containers are provided with opening-closing gates which can be connected to each other, and said substrate to be processed is transferably movable between said vacuum containers exclusively for use for processing and said vacuum container exclusively for use for conveyance.

2. A vacuum processing apparatus according to claim 1, having a plurality of vacuum containers exclusively for use for processing.

3. A vacuum processing apparatus according to claim 1, having a plurality of vacuum containers exclusively for use for processing and a plurality of vacuum containers exclusively for use for conveyance.

4. A vacuum processing apparatus according to claim 1, wherein said vacuum containers exclusively for use for processing are for processing a formed film.

5. A vacuum processing apparatus according to claim 1, further having a container for receiving the unprocessed substrate.

6. A vacuum processing apparatus according to claim 1, further having a container exclusively for use for post-processing into which the processed substrate removed from said vacuum container exclusively for use for processing is received through said container exclusively for use for conveyance.

7. A vacuum processing apparatus according to claim 6, wherein said container exclusively for use for post-processing has cooling means.

8. A vacuum processing apparatus according to claim 1, wherein said vacuum container exclusively for use for conveyance is linearly movable.

9. A vacuum processing apparatus according to claim 1, wherein said vacuum container exclusively for use for conveyance is rotatively movable.

* * * * *